United States Patent [19]

Yun

[11] Patent Number: 5,793,215
[45] Date of Patent: Aug. 11, 1998

[54] 6 PORT TEM CELL AND RADIATION FIELD IMMUNITY MEASURING SYSTEM USING THE SAME

[75] Inventor: Jae-Hoon Yun, Daejeon, Rep. of Korea

[73] Assignee: Electronics and Telecommunications Research Institute, Daejeon-shi, Rep. of Korea

[21] Appl. No.: 577,664

[22] Filed: Dec. 22, 1995

[30] Foreign Application Priority Data

Dec. 23, 1994 [KR] Rep. of Korea ............... 1994-36341

[51] Int. Cl.$^6$ .............................................. H01P 1/00
[52] U.S. Cl. .................. 324/627; 324/628; 324/632; 333/244; 333/243
[58] Field of Search ..................... 333/243, 244; 324/627, 628, 632

[56] References Cited

U.S. PATENT DOCUMENTS

| | | |
|---|---|---|
| 4,255,750 | 3/1981 | Riley .................................. 324/627 |
| 4,605,916 | 8/1986 | Tehori . | |
| 5,153,524 | 10/1992 | McCormack ....................... 324/627 |
| 5,327,091 | 7/1994 | Loughry ............................. 324/627 |
| 5,436,603 | 7/1995 | Fischer ............................... 324/627 |
| 5,514,971 | 5/1996 | Hankui ............................... 324/628 |

OTHER PUBLICATIONS

Kruse: "A TEM test cell for Consumer Products Emission and Susceptibility Measurements"—IEEE Trans–Consumer Electronics May 1979—US Cl 324/627.

*Primary Examiner*—Vinh P. Nguyen
*Assistant Examiner*—Jose M. Solis
*Attorney, Agent, or Firm*—Jacobson, Price, Holman & Stern, PLLC

[57] ABSTRACT

A 6 port TEM cell for measuring garbage EMI/EMS of an electrical and electronic equipment which can form an electromagnetic field of horizontal/vertical polarization using characteristic that internal electric field polarization is changed according to feeder line selection inside a multi-transmission line, and coupling amount among internal conductors is reduced by positioning the spherical internal conductors at corners of external conductors, thereby widening a test area.

10 Claims, 7 Drawing Sheets

6 PORT TEM CELL AND RADIATION FIELD IMMUNITY MEASURING SYSTEM USING THE SAME

BACKGROUND OF THE INVENTION

A. Field of the Invention

The present invention relates to a 6 port transverse electromagnetic TEM cell and radiation field immunity measuring system using the same. More particularly, the present invention relates to a 6 port TEM cell for measuring EMI/EMS of an electrical and electronic equipment which can generate standard electromagnetic field of horizontal/vertical polarization using characteristic that internal electric field polarization is changed according to feeder line selection inside a multi transmission line, and coupling amount among internal conductors is reduced by positioning the spherical internal conductors at corners of external conductors, thereby widening a test area.

B. Description of the Prior Art

A conventional transverse electromagnetic (TEM) cell was invented by Croford of National Bureau of Standards NBS of United States of America in 1971. The TEM cell by Croford has an asymmetric construction and internal conductors thereof are positioned at the center inside of the TEM cell. Accordingly, the conventional TEM cell has a disadvantage in that the test area is small.

To overcome the above-mentioned disadvantage, an asymmetric TEM cell which widens the test area by disposing the internal conductors on an upper position inside the TEM cell is provided.

The test area means a uniform field area, and is defined as a central area having one third width of walls of the internal and external conductors in international standards, that is, IEC (International Electrotechnical Commission) 1000-4-3 and Pub. 24. In addition, a test object must be in the test area.

However, this TEM cell also has a disadvantage in that the homogeneous field area becomes small because of the part of the cell which the internal conductors occupy as illustrated in FIG. 4B.

In addition, a orientation of test object must be varied to carry out a test for horizontal polarization when measuring radiation electromagnetic wave immunity. Accordingly, it is not possible to perform the immunity test for an electrical and electronic equipment such as a microwave oven since it is possible to make the immunity test only when the test object is in the microwave oven. Also, it has another disadvantage in that the powers and relative when measuring electromagnetic interference (EMI).

An automatic measuring TEM cell that solves the disadvantage of polarization.

The automatic measuring TEM cell can solve the above-mentioned problem by rotating the internal conductors mechanically, however, it still has a disadvantage in that the test area is small because the automatic measuring TEM cell has the same asymmetric construction as the asymmetric TEM cell.

SUMMARY OF THE INVENTION

The object of the present invention is to provide a 6 port transverse electromagnetic TEM cell and radiation field immunity measuring system using the same which can widen a test area by positioning three internal conductors having circular cross sections at corners inside of an external conductors having a rectangular cross sections, and control voluntarily polarization by selecting two internal conductors which are located near to a side of the external conductor, and feeding in-phase.

To achieve the object of the invention, as embodied and broadly described herein, in a transverse electromagnetic (TEM) cell for measuring EMI/EMS of an electrical and electronic equipment, the 6 port transverse electromagnetic (TEM) cell according to a preferred embodiment of the present invention comprises a test object area having an area in which a test object is disposed; a coaxial connector connection area for connecting a coaxial connector and a test object area which are different each other to make impendance matching and to make transmission of high voltage possible; and a taper area for connecting the test object area and the coaxial connector connection area.

According to another aspect of the present invention, the radiation electromagnetic field immunity test measuring system according to a preferred embodiment of the present invention includes a control box; at least first, second and third switches located in the control box; a first N-type connector connected to a first T-connector (or a voltage divider) in the control box; a second N-type connector and a third N-type connector connected to respective terminals of the first switch; a fourth N-type connector connected to a second T-connector in the control box; and a fifth N-type connector connected to a terminal of the second switch, the third N-type connector being connected to a further terminal of the second switch, one further terminal of the first switch being connected to the third switch, and another terminal of the first switch being connected to the first T-connector (or the voltage divider), and an output terminal of the third switch being connected to one of ground and a test operation checking device; one further terminal of said second switch being connected to the third switch and another terminal of said second switch being connected to the second T-connector (or the voltage divider) and the output terminal of the third switch being connected to the other of ground or the test object operation checking device.

The objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings illustrate embodiments of the invention and, together with the description, serve to explain the principles of the invention. In the drawings.

DESCRIPTION OF THE PREFERRED EMBODIMENT

Reference will now be made in detail to preferred embodiment of the present invention, an example of which is illustrated in the accompanying drawings. Wherever possible, the same reference numbers will be used throughout the drawings to refer to the same or like parts.

Figure 1:
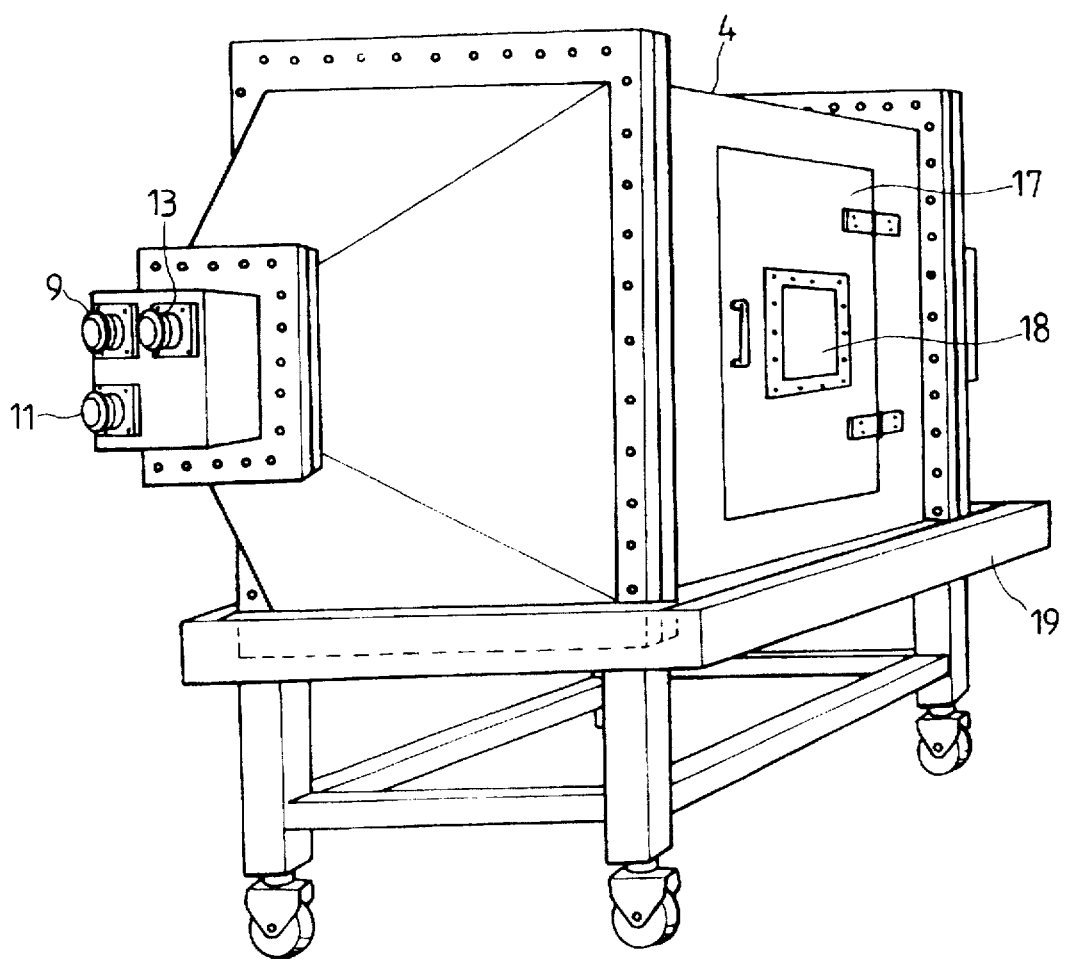
FIG. 1 is a schematic perspective view illustrating a construction of a 6 port transverse electromagnetic cell according to a preferred embodiment of the present invention.
Figure 2A:
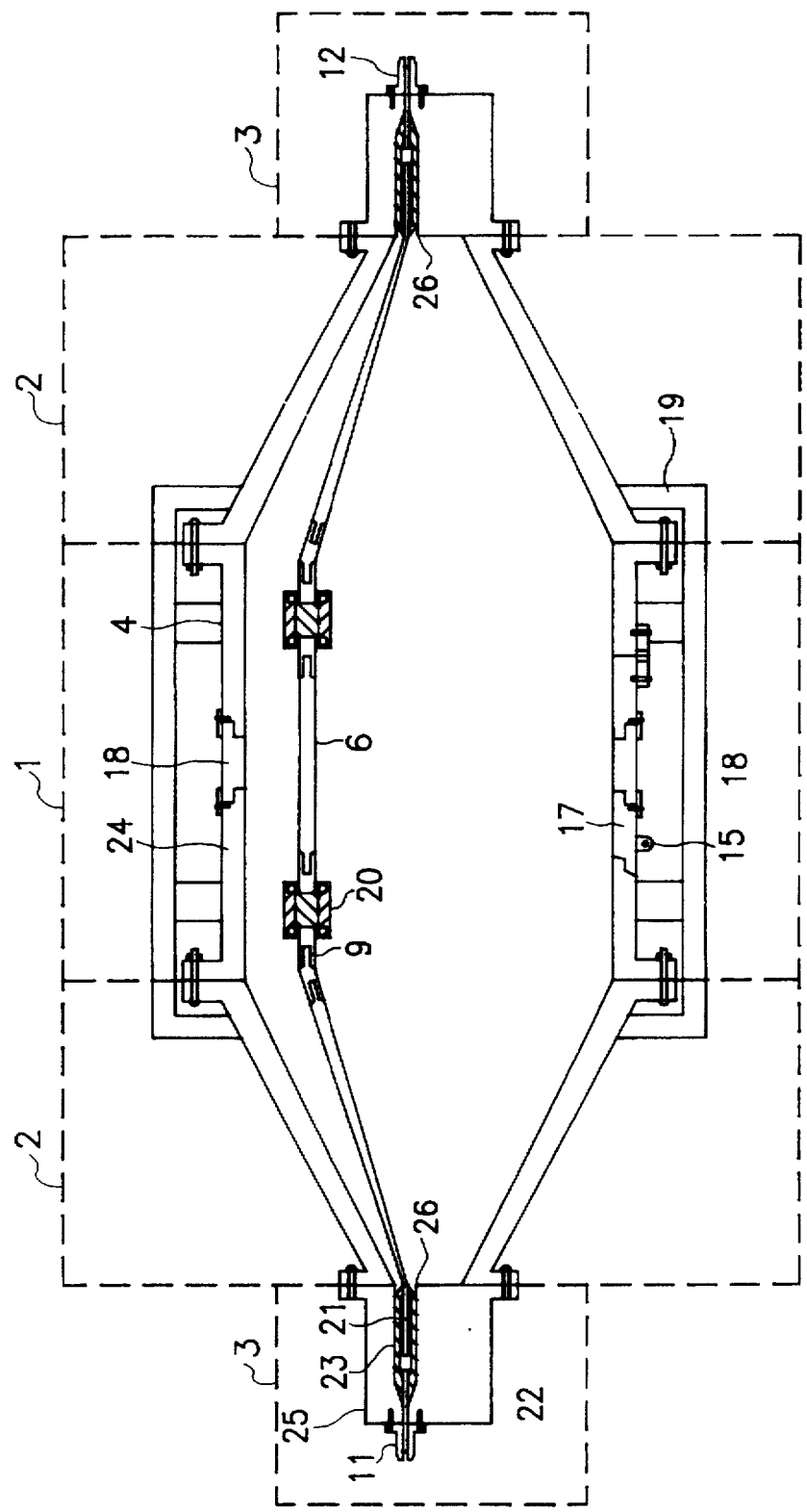
FIGS. 2A to 2C are plan, front and side sectional views respectively illustrating constructions of principle parts of a 6 port transverse electromagnetic cell according to a preferred embodiment of the present invention.
Figure 2B:
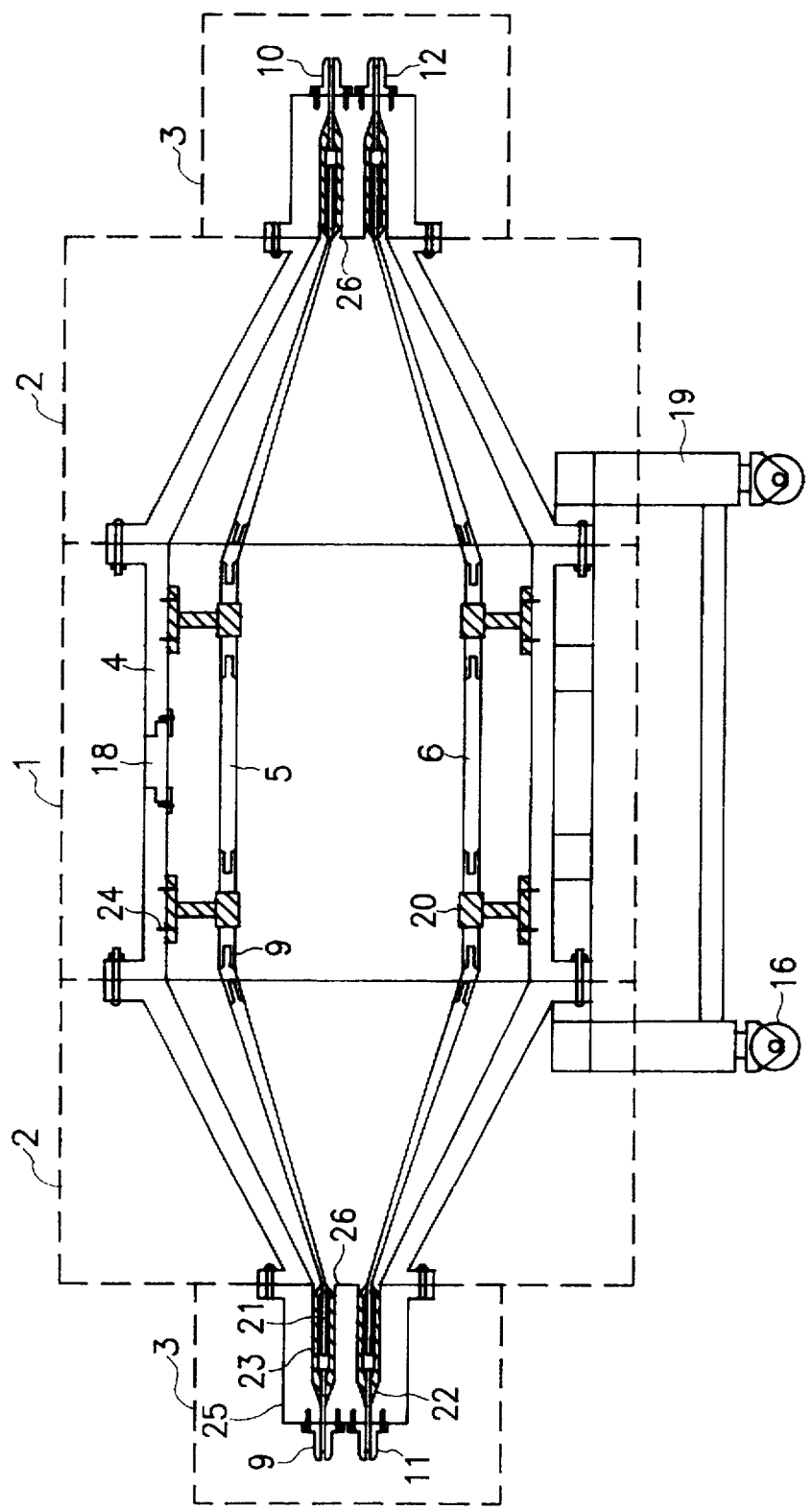
Figure 2C:
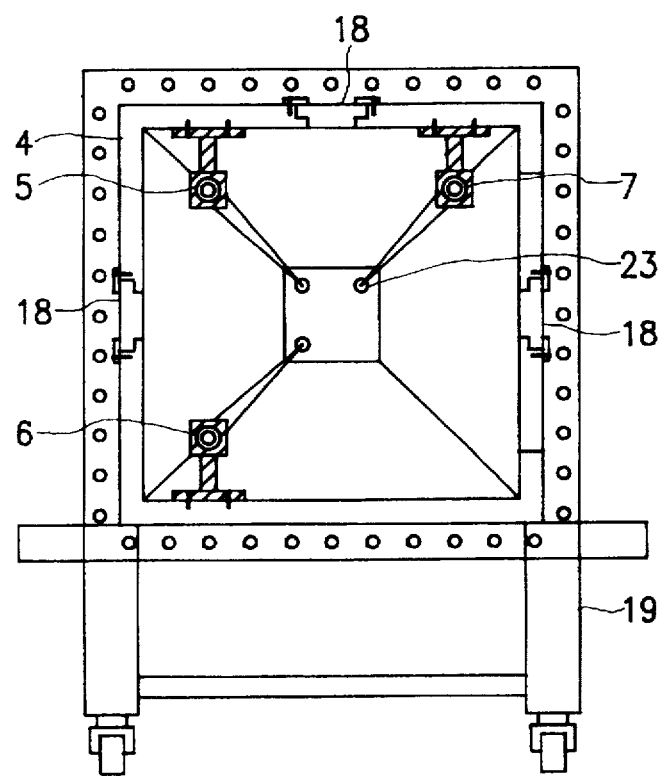
Figure 3:
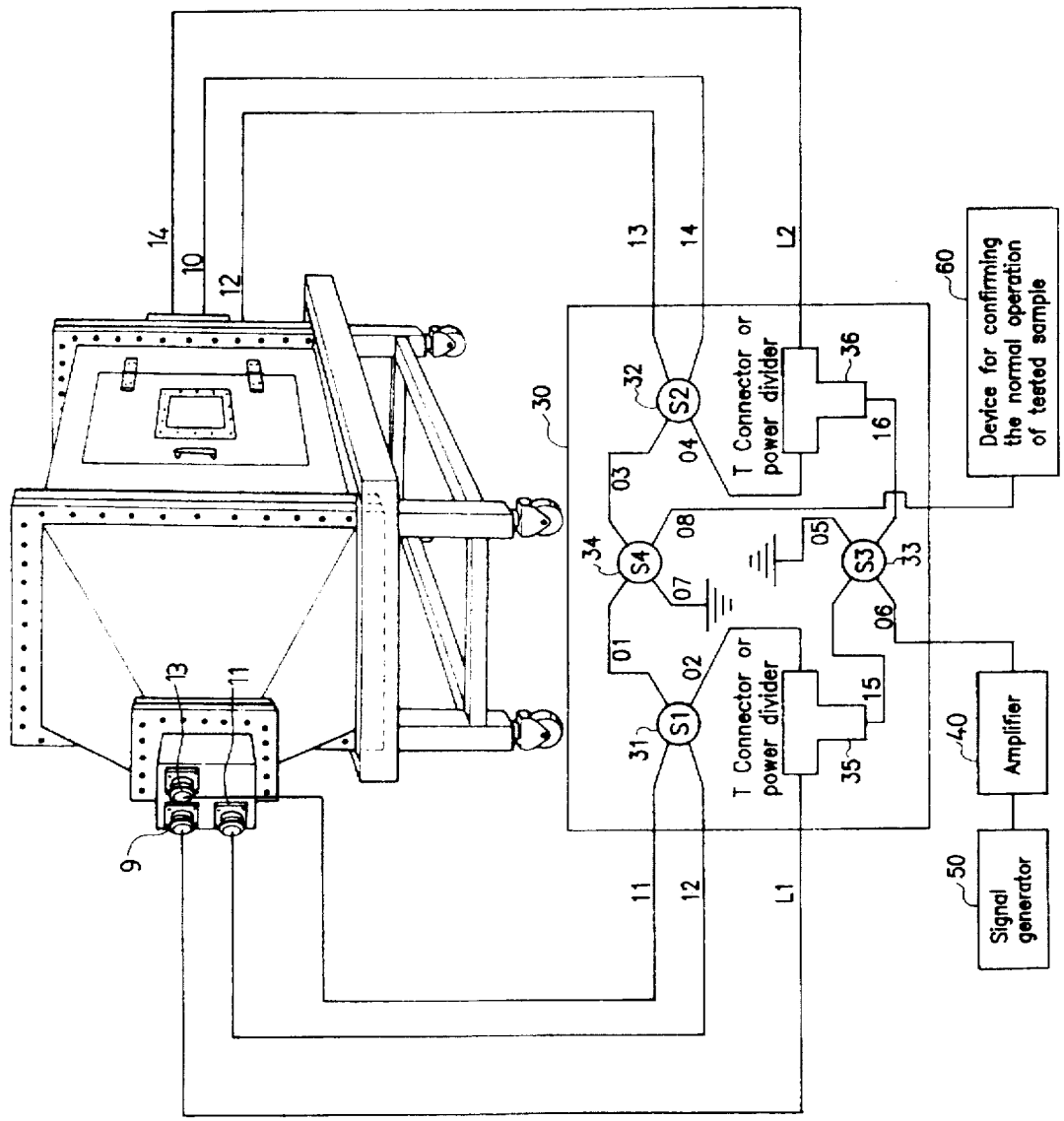
FIG. 3 is a view illustrating a construction of a radiation field immunity measuring system using a 6 port transverse electromagnetic cell according to a preferred embodiment of the present invention.

FIG. 1 is a schematic perspective view illustrating a construction of a 6 port transverse electromagnetic cell according to a preferred embodiment of the present invention;

FIGS. 2A to 2C are plan, front and side sectional views respectively illustrating constructions of principle parts of a 6 port transverse electromagnetic cell according to a preferred embodiment of the present invention; FIG. 3 is a view illustrating a construction of a radiation field immunity measuring system using a 6 port transverse electromagnetic cell according to a preferred embodiment of the present invention; and FIGS. 4A to 4B are views respectively illustrating uniform field areas of a 6 port TEM cell according to a preferred embodiment of the present invention and a conventional asymmetric TEM cell.

Referring to FIGS. 1 and 2A to 2B, the test object area 1 having a construction of multi transmission line includes a supporting member 20 in which three internal conductors 5, 6 and 7 are disposed in corners thereof and for supporting the three internal conductors 5, 6 and 7, a shield 24 made of non-conductive material such as hard plastic to reduce influence of an internal electromagnetic field, a door 17 and shielding windows 18.

Figure 4A:
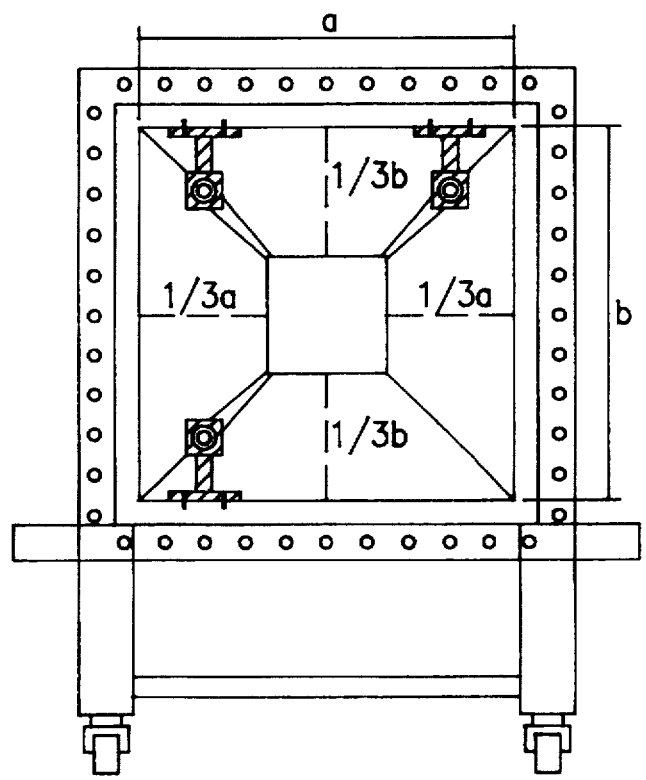
FIGS. 4A and 4B are views respectively illustrating homogeneous or uniform field areas of a 6 port TEM cell according to a preferred embodiment of the present invention and a conventional asymmetric TEM cell.
Figure 4B:
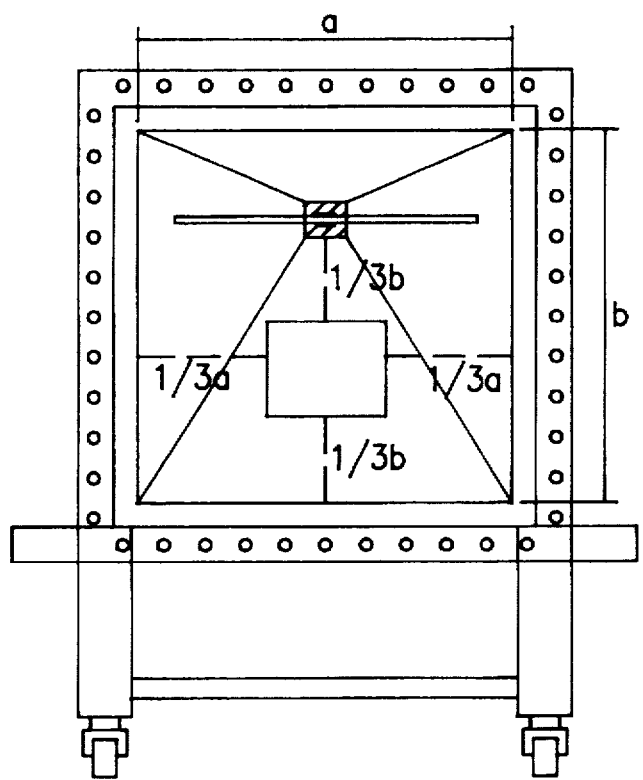

FIG. 4A is a view illustrating a uniform field area (a slant portion) of a 6 port TEM cell according to a preferred embodiment of the present invention, and FIG. 4B is a view illustrating a uniform field area (a slant portion) of a conventional asymmetric TEM cell having the same size to the 6 port TEM cell according to the preferred embodiment of the present invention.

Referring to FIGS. 4A to 4B, it is noted that the 6 port TEM cell according to the preferred embodiment of the present invention has much wider uniform field area than that of the conventional asymmetric TEM cell.

However, the 6 port TEM cell according to the preferred embodiment of the present invention has a disadvantage in that uniformity in the internal electromagnetic field is poor since the internal conductors having small spherical shapes are disposed at the corners of the 6 port TEM cell.

The above-mentioned disadvantage can be overcome by feeding in-phase to the first internal conductor 5 and the second internal conductor 6, or the first internal conductor 5 and the third internal conductor 7.

The internal electromagnetic field having higher uniformity can be formed because left and right field elements which lower uniformity are decreased if the first internal conductor 5 and the third internal conductor 7 is fed in-phase to produce a vertical electromagnetic field. Accordingly, a field distribution graph which satisfies uniformity evaluation (Recognized as the electromagnetic wave immunity test system only when 6 dB occupied area ratio is above 75 percents) of field absolute value distribution required by International Electrotechnical Commission (EIC) can be easily made.

For example, the occupied area ratio is 93 percent in the case of 3 port TEM cell of 50Ω having the external conductor of 1 m * 1 m and a radius of 0.057 m.

Referring to FIGS. 2C and 2D, the first, second and third internal conductors 5, 6 and 7 are circular, but may be spherical to make the internal conductors thinner or narrower by increasing the capacitance coupling.

In addition, a door 10 is mounted in a direction in which the internal conductors are not positioned in this area, thereby making installation of the test object easier, and shielding windows 18 having high shielding effect are formed in three sides respectively to enable observation of the operation of the test object effectively.

The material of the shielding windows 18 may be a transparent material such as glass and plastic coated with gold, silver and so on, or a wire mesh made of metal.

In coaxial connector connection areas 3, impedance matching is made and transmission of high voltage is possible since a sectional construction of the test object area (Refer to FIG. 2C) is different from that of a coaxial connector.

The coaxial connector connection areas 3 include a fifth internal conductor 21, a second external conductor 25, an internal dielectric 23 and a plurality of N-type connectors 9, 10, 11, 12, 13 and 14.

A section of the fifth internal conductor 21 is maintained spherical because the constructions of the first, second and third internal conductors 5, 6 and 7 in a taper area 2, and the fifth internal conductor 21 is prefabricated for ease of assembling.

The second external conductor 25 includes three openings in which the fifth internal conductor 21 is inserted and mounted, and the sectional constructions of the openings are spherical as are that of the internal conductors (Refer to FIG. 2C).

At this point, the fifth internal conductor includes a central opening in which the first, second and third internal conductors are inserted, and another opening formed in an opposite direction in the same axis and connected to an N-type coaxial connector by an internal conductor pin 22.

A non-conductive dielectric 23 (for example, Teflon and so on) is inserted and mounted in a connection portion of the fifth internal conductor and the N-type coaxial connector to fix the internal conductors 5, 6, 7 and 21.

To reduce short pass occurring often in a cornered portion 26, the cornered portion 26 may be curved. That is, the cornered portion 26 can become wider gradually toward the taper area 2.

The taper area 2 connects the coaxial connector connection area 3 and the test object area 1. The cross section of the taper area 2 is the same as that of the test object area 1, and becomes smaller gradually toward the coaxial connector connection area 3. This construction has a close relation to available frequency along with the construction of the test object area 1.

The smaller in size and length, the smaller the test object area 1, but the wider the range of the available frequencies. Accordingly, the effective length should be short in this area. A curved construction can be applied to make the effective length short (Refer to Korean Patent Application No. 93-29386).

That is, the curved construction having an internal center is formed toward the test object area 1, and to the contrary the curved construction having an external center is formed toward the coaxial connector connection area 3.

FIG. 3 is a view illustrating a construction of a radiation field immunity measuring system using a 6 port transverse electromagnetic cell according to a preferred embodiment of the present invention.

A first left N-type connector 9 is connected to a first T-connector 35 (or a voltage divider) in the left of a control box 30 illustrated in FIG. 3. A second left N-type connector 11 and a third left N-type connector 13 are connected to a first switch (S1) 31. One terminal thereof is connected to a further switch (S4) 34 and the other terminal thereof to the first T-connector 35 (or the voltage divider).

An output terminal of the switch (S4) 34 is terminated or connected to a test object operation checking device 60. At this time, the whole or overall length of each transmission line connected to the first T-connector 35 (or the voltage divider) should be the same for one as for another. That is to say, lines L1, I1+02, I2+02 have the same length.

In addition, a first right N-type connector 10 is connected to a second T-connector 36 (or a voltage divider) in the right of the control box 30 illustrated in FIG. 3. A second right N-type connector 12 and a third left N-type connector 14 are connected to an additional switch (S2) 32. One terminal thereof is connected to the further switch (S4) 34 and the other terminal thereof to the second T-connector 36 (or the voltage divider).

The output terminal of the further switch S4 34 is terminated or connected to the test object operation checking device 60. At this time, the whole or overall length of each transmission line connected to the second T-connector 36 (or the voltage divider) should be the same for one as for another. That is to say, lines L2, I3+04, I3+04 have the same length.

The first and second T-connector 35 and 36 are connected to yet another switch (S3) 33. One terminal thereof is connected to an amplifier 40 and a signal generator 50, and the other terminal thereof is terminated.

First, the test object (such as various kinds of electrical and electronic equipments) is disposed in the uniform field area in the 6 port TEM cell to carry out the radiation field immunity test required by the international standard, IEC801-3 and IEC1000-4-3 by the measuring system according to the preferred embodiment of the present invention.

The immunity test may be performed as follows.

I) To form a vertical radiation field by operating the switch S1 31, I1 is connected to 02, and 02 to 01. To make a radio wave advance from left to right by operating the switch S3 33, I6 is connected to 05, I5 to 06. To make the use of the non-feeder line as a test object operation sensor by operating the switch S4 34, 01 is connected to 08, and 03 to 07.

And then 1 KHz 80 percents amplified signals are produced from the signal generator 50 by each frequency, amplified to a test level (1 level : 1 V/m, 2 level : 3 V/m, 3 level : 10 V/m) by the amplifier 40, and irradiated to the test object.

At this time, an observer observes with the naked eyes whether the test object operates normally through the shielding windows 18, and at the same time, observes electrically whether the test object operates normally through use of the test object operation checking device 60, for example, a spectrum analyzer, an oscilloscope, a field strength meter and so on.

Since the coupling amount among the internal conductors is very low (For example, attenuation coupling below 45 dB occurs in the case of the 6 port TEM cell of 50Ω having the external conductor of 1 m * 1 m and the radius of 0.057 m) in the light of the construction of the 6 port TEM cell, current inducted in the non-feeder internal conductors contains radiation noise produced when the test object operates. Therefore, the observer can determine whether the test object operates normally by observing the radiation noise.

For example, the radiation noise is removed all at once when the operation of the system stops, and a sudden change in the radiation noise occurs when the system operates abnormally.

II) To form a switch horizontal radiation field by operating the switch S1 31, I1 is connected to 01, and I2 to 02. And then, the immunity test by each frequency is carried out as above. After this process, the radiation field immunity test for the vertical/horizontal polarization for the first surface of the test object is finished.

III) To form a vertical radiation field by operating the switch S2 32, I3 is connected to 04, and I4 to 03. To make the radio wave advance from right to left by operating the switch S3 33, I6 is connected to 06 and I5 to 05, and by operating the switch S4 34, 01 is connected to 07 and 03 to 08, thereby performing the vertical radiation field immunity test by each frequency.

IV) By operating the switch S2 32, I3 is connected to 03 and I4 to 05, thereby performing the horizontal radiation field immunity test by each frequency.

Unlike the I and II process, the radiation field immunity test of the vertical/horizontal polarization in the opposite direction of the test object is finished as above.

If the I to IV process is performed again after the above test is finished and the test object is rotated at an angle of ninety degrees (forward or reward), the vertical/horizontal radiation field immunity test for four sides is finished.

When examining the above test, the test object has only one azimuth change during the radiation field immunity test as an automatic measuring TEM cell (Korean Patent Application No. 94-22875).

The azimuth change of the test object is required four times in the immunity test of the conventional TEM cell, eight times in the resistance test of a GTEM cell, and four times in the immunity test of a triple TEM cell.

The system of the present invention has advantages of easy measurement and a reduction of the measurement time required by reducing the azimuth change number and varied range of the test object.

In addition, since information (voltage, a sum, difference voltage, a relative phase difference and so on transmitted in both terminals) more than 5 times by one azimuth change of the test object is obtained compared with the conventional TEM cell when performing EMI measurement using the system of the present invention, and the information more than 10 times compared with the conventional GTEM cell, and the information more than 3 times at least compared with the conventional triple TEM cell, it is easy to measure and possible to reduce the time.

Also, it is possible to perform the EMI and EMS measurement for more various kinds of test objects because the wider test area is obtained by using the 6 port TEM cell of the present invention compared with the conventional TEM cell.

The effect of the system of the present invention lies in that the measuring is easy and the measurement time is reduced by reducing the azimuth change number and varied range of the test object required when performing the EMI and EMS measurement owing to the constructional characteristic of the 6 port TEM cell of the present invention.

More particularly, the observer can observe the test object with the naked eyes through the shielding windows formed in the three sides or by the electric signal transmitted by the non-feeder internal conductor during the radiation field immunity test, thereby the observer can objectively determine whether the test object operates normally.

The result of the test can be provided with a test requester as an available data when disputing with the test requester about whether the test object operates normally in the immunity test.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A transverse electromagnetic (TEM) cell for measuring electromagnetic interference and electromagnetic immunity of electrical and electronic equipment, said TEM cell comprising:

a test object area for receiving a test object, said test area including:
   a hollow external conductor having a rectangular cross section defining four corners; and
   a first three internal conductors located at three of said four corners inside of said external conductor, said internal conductors each having a circular cross section;

first and second tapered areas connected to opposite sides of said test object area, said first and second areas each including:
   a hollow external conductor having a cross sectional area which decreases in a direction away from said test object area; and
   a second three internal conductors connected to said first three internal conductors and of decreasing size in said direction away from the test object area, said three further internal conductors being bent at the connection to said first three internal conductors; and first and second coaxial connector connection areas connected, respectively, to said first and second tapered areas for providing impedance matching and transmission of high voltage, each of said coaxial connector areas including:
   a second external conductor having three holes therein for connection to coaxial connectors; and
   three further internal conductors, connected to respective second internal conductors of a respective one of said first and second tapered areas.

2. A TEM cell as claimed in claim 1, wherein the test object area further includes:
   a supporting member for supporting each of said first three internal conductors; and
   a door permitting for installing a test object and first, second and third shielding windows in three sides of the external conductor of said test object area for enabling observation of a test object in the test object area.

3. The 6 port TEM cell according to claim 2, wherein cross sections of said first, second and third internal conductors are circular.

4. The 6 port TEM cell according to claim 1, wherein the first coaxial connector connection area includes:
   a first N-type connector disposed on one side of said three internal conductors of said coaxial connector connection area;

and wherein the second coaxial connection area includes:
   a connecting member for connecting a further N-type connector disposed on the other side of said three internal conductors of said coaxial connector connection area.

5. The 6 port TEM cell according to claim 4, wherein a corner of said second external conductor contacting an internal conductor in the coaxial connector connection areas is curved.

6. A radiation field immunity test system comprising:
   a control box;
   at least first, second and third switches located in said control box;
   a first N-type connector connected to a first T-connector in the control box;
   a second N-type connector and a third N-type connector connected to respective terminals of the first switch;
   a fourth N-type connector connected to a second T-connector in the control box; and
   a fifth N-type connector connected to a terminal of the second switch;
   the third N-type connector being connected to a further terminal of the second switch;
   one further terminal of said first switch being connected to the third switch and another terminal of the first switch being connected to the first T-connector, and an output terminal of the third switch being connected to one of (i) ground and (ii) a test object operation checking device and
   one further terminal of said second switch being connected to the third switch and another terminal of said second switch being connected to the second T-connector, and the output terminal of the third switch being connected to the other of (i) ground or (ii) the test object operation checking device.

7. The 6 port TEM cell according to claim 1, wherein each said taper area tapers gradually a narrower cross section at the corresponding test object area to a greater cross section at the corresponding coaxial connector connection area, and has a curved construction including an internal center formed toward the test object area.

8. The 6 port TEM cell according to claim 1, wherein each said taper area tapers gradually from a narrower cross section at the corresponding test object area to a greater cross section at the corresponding coaxial connector connection area, and has a curved construction including an internal center formed toward the corresponding test object area and an external center formed toward the corresponding coaxial connector connection area.

9. The radiation field immunity test system according to claim 6, wherein the second T-connector is connected to a test cell by transmission lines of the same overall length.

10. The radiation field immunity test system according to claim 6, wherein the first T-connector is connected to a test cell by transmission lines of the same overall length.

* * * * *